(12) United States Patent
Kameshima et al.

(10) Patent No.: US 7,839,474 B2
(45) Date of Patent: Nov. 23, 2010

(54) ANTIGLARE FILM

(75) Inventors: Hisamitsu Kameshima, Tokyo (JP); Tomo Yoshinari, Tokyo (JP); Yusuke Tochigi, Tokyo (JP); Kae Takahashi, Tokyo (JP); Takahiro Morinaga, Tokyo (JP)

(73) Assignee: Toppan Printing Co., Ltd. (JP)

( * ) Notice: Subject to any disclaimer, the term of this patent is extended or adjusted under 35 U.S.C. 154(b) by 225 days.

(21) Appl. No.: 12/202,128

(22) Filed: Aug. 29, 2008

(65) Prior Publication Data

US 2009/0059377 A1    Mar. 5, 2009

(30) Foreign Application Priority Data

Sep. 3, 2007    (JP) ............... 2007-227466

(51) Int. Cl.
  G02F 1/1335 (2006.01)
  B32B 5/16 (2006.01)
(52) U.S. Cl. .......... 349/137; 428/323; 359/601
(58) Field of Classification Search ........... 349/137; 359/599, 601; 428/141, 212, 220, 323
  See application file for complete search history.

(56) References Cited

U.S. PATENT DOCUMENTS

| 7,041,360 | B2 * | 5/2006 | Masaki et al. ............. 428/141 |
| 7,245,434 | B2 * | 7/2007 | Nishida et al. ............. 359/599 |
| 7,628,496 | B2 * | 12/2009 | Matsuura .................. 359/601 |
| 2006/0134427 | A1 * | 6/2006 | Horio et al. ............. 428/411.1 |
| 2006/0159902 | A1 * | 7/2006 | Suzuki ..................... 428/212 |
| 2007/0253064 | A1 * | 11/2007 | Ookubo et al. ............. 359/599 |
| 2008/0030861 | A1 * | 2/2008 | Ookubo et al. ............. 359/601 |
| 2009/0015926 | A1 * | 1/2009 | Iwata et al. ............... 359/601 |
| 2009/0262429 | A1 * | 10/2009 | Ookubo et al. ............. 359/599 |
| 2010/0039708 | A1 * | 2/2010 | Suzuki et al. ............. 359/601 |
| 2010/0097705 | A1 * | 4/2010 | Furui et al. ............... 359/599 |

FOREIGN PATENT DOCUMENTS

| JP | 06-018706 | 1/1994 |
| JP | 11-160505 | 6/1999 |
| JP | 11-305010 | 11/1999 |
| JP | 11-326608 | 11/1999 |
| JP | 2000-180611 | 6/2000 |
| JP | 2000-338310 | 12/2000 |
| JP | 2003-004903 | 1/2003 |
| JP | 2003-260748 | 9/2003 |
| JP | 2004-004777 | 1/2004 |

* cited by examiner

*Primary Examiner*—Mark Consilvio
(74) *Attorney, Agent, or Firm*—Squire, Sanders & Dempsey L.L.P.

(57) ABSTRACT

An antiglare film includes an antiglare layer having particles and a binder matrix on a transparent base material. An antiglare film surface on the antiglare layer side has a concave-convex structure with a ten-point average roughness ($Rz_1$) equal to or larger than 0.08 μm and equal to or smaller than 0.10 μm at a cutoff wavelength ($\lambda_c$) of 0.008 mm, the antiglare film surface on the antiglare layer side has a concave-convex structure with a ten-point average roughness ($Rz_2$) equal to or larger than 1.90 μm and equal to or smaller than 2.50 μm at a cutoff wavelength ($\lambda_c$) of 0.8 mm, and the antiglare film surface on the antiglare layer side has a concave-convex structure with an average spacing (S) between local peaks equal to or larger than 0.033 mm and equal to or smaller than 0.050 mm at a cutoff wavelength ($\lambda_c$) of 0.8 mm.

6 Claims, 6 Drawing Sheets

(a)

(b)

(a)

(b)

ANTIGLARE FILM

CROSS REFERENCE TO RELATED APPLICATION

This application is based on and claims the benefit of priority from the Japanese Patent Application number 2007-227466, filed on Sep. 3, 2007; the entire contents of which are incorporated herein by reference.

BACKGROUND OF THE INVENTION

1. Field of the Invention

The present invention relates to an antiglare film that is provided on the surface of a window, a display, and the like. In particular, the present invention relates to an antiglare film that is provided on the surface of a display such as a liquid crystal display (LCD), a CRT display, an organic electroluminescence display (ELD), a plasma display (PDP), a surface electric field display (SED), and a field emission display (FED).

2. Description of the Related Art

In the field of displays such as liquid crystal displays, CRT displays, EL displays, and plasma displays, providing on the display surface an antiglare film having a concave-convex structure on the surface is known as means for preventing the degradation of visibility caused by reflection of external light on the display surface during viewing.

The following methods are known for producing such antiglare films:
a method of forming a concave-convex structure on an antiglare film surface by emboss processing;
a method of coating a coating liquid obtained by admixing particles to a binder matrix forming material and dispersing the particles in the binder matrix, thereby forming a concave-convex structure on an antiglare film surface.

In an antiglare film having on the surface thereof a concave-convex structure formed by the above-described methods, the external light falling on the antiglare film is scattered by the concave-convex structure of the surface. As a result, the image of external light becomes smudgy and the degradation of visibility caused by the reflection of external light on the display surface can be prevented.

In the antiglare film in which convexities and concavities have been formed on the surface by emboss processing, surface convexities and concavities can be completely controlled. As a result, reproducibility is good. However, the problem is that where defects or foreign matter are present on the emboss roll, the defects spaced by a roll pitch appear on the film.

On the other hand, an antiglare film using a binder matrix and particles can be produced by using fewer operations than the antiglare film employing the emboss processing. As a result, the antiglare film can be manufactured at a low cost. Accordingly, antiglare films of a variety of forms in which particles are dispersed in a binder matrix are known (Japanese Patent Application Publication (JP-A-6-18706) No. 6-18706).

For example, the following methods for producing antiglare films using a binder matrix and particles have been disclosed:
a method using a binder matrix resin, spherical particles, and particles of irregular shape (JP-A-2003-260748);
a method using a binder matrix resin and particles of a plurality of different diameters (JP-A-2004-004777);
a method of using a film having surface convexities and concavities in which the cross-sectional area of convexities is specified (JP-A-2003-004903).

The following methods have also been disclosed:
a method of using internal scattering in combination with external scattering and setting an internal haze of an antiglare film to 1-15% and a surface haze to 7-30% (JP-A-11-305010);
a method of using a binder resin and particles with a size of 0.5-5 µm and setting the difference in refractive index between the resin and the particles to 0.02-0.2 (JP-A-11-326608);
a method of using a binder resin and particles with a size of 1-5 µm and setting the difference in refractive index between the resin and the particles to 0.05-0.15, and a method in which the properties of the solvent used and the surface roughness are set within the predetermined ranges (JP-A-2000-338310);
a method of using a binder resin and a plurality of particles and setting the difference in refractive index between the resin and the particles to 0.03-0.2 (JP-A-2000-180611);
a method of setting a surface haze to 3 or more and setting the difference between a haze value in the normal direction and a haze value in the direction at ±60° to 4 or less with the object of reducing the variations in hue and the decrease in contrast occurring when the viewing angle changes (JP-A-11-160505).

Thus, antiglare films of various configurations created to attain a variety of objects have been disclosed.

The properties of antiglare films used for the front surface of displays vary depending on the display type. In other words, the optimum antiglare film depends on the display resolution or object of use. Therefore, antiglare films of a large number of types are required according to the application object.

In displays for monitors of notebook personal computers and desktop personal computers, the user most often views the display screen for a long time from a front direction. Accordingly, antiglare films for use in monitors of notebook personal computers and desktop personal computers have to have the following properties: (1) high antiglare ability that makes it possible to smudge the image of external light falling on the display surface in the direction normal to the display screen, that is, in the front direction, and prevent the reflection of the external light image, and (2) absence of a white blurring phenomenon occurring when external light, in particular illumination such as from a fluorescent lamp, falls on the display surface. In addition, because the antiglare films are often used at work sites, the surface thereof is strongly required to have (3) high abrasive resistance. It is an object of the present invention to provide an antiglare film that combines: (1) high antiglare ability in the front direction; (2) absence of white blurring; and (3) high abrasive resistance.

SUMMARY OF THE INVENTION

According to one aspect of the present invention, there is provided an antiglare film including an antiglare layer having particles and a binder matrix on a transparent base material, wherein an antiglare film surface on the antiglare layer side has a concave-convex structure with a ten-point average roughness ($Rz_1$) equal to or larger than 0.08 µm and equal to or smaller than 0.10 µm at a cutoff wavelength ($\lambda_c$) of 0.008 mm, the antiglare film surface on the antiglare layer side has a concave-convex structure with a ten-point average roughness ($Rz_2$) equal to or larger than 1.90 µm and equal to or smaller than 2.50 µm at a cutoff wavelength ($\lambda_c$) of 0.8 mm, and the antiglare film surface on the antiglare layer side has a concave-convex structure with an average spacing (S) between local peaks equal to or larger than 0.033 mm and equal to or smaller than 0.050 mm at a cutoff wavelength ($\lambda_c$) of 0.8 mm.

According to another aspect of the present invention, there is provided a transmissive liquid crystal display including the above-described antiglare film, a polarizing plate, a liquid crystal cell, a polarizing plate, and a backlight unit, in the order of description from an observer side.

DETAILED DESCRIPTION OF THE INVENTION

Figure 1:
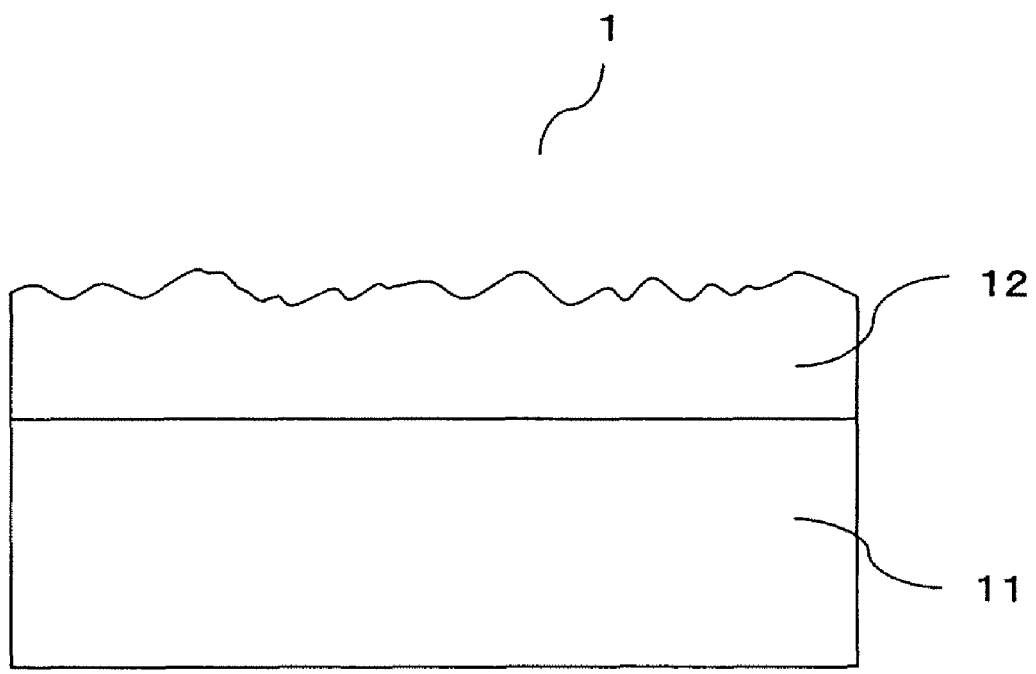
FIG. 1 is a cross-sectional schematic view of the antiglare film in accordance with the present invention.

The antiglare film in accordance with the present invention will be described below. FIG. 1 is a cross-sectional schematic view of the antiglare film in accordance with the present invention. An antiglare film (1) in accordance with the present invention has an antiglare layer (12) on a transparent base material (11), and the antiglare layer surface has a concave-convex structure. In the antiglare film in accordance with the present invention, (a) the surface on the antiglare layer has a concave-convex structure with a ten-point average roughness ($Rz_1$) equal to or larger than 0.08 μm and equal to or smaller than 0.10 μm at a cutoff wavelength ($\lambda_c$) of 0.008 mm, (b) the surface of the antiglare layer has a concave-convex structure with a ten-point average roughness ($Rz_2$) equal to or larger than 1.90 μm and equal to or smaller than 2.50 μm at a cutoff wavelength ($\lambda_c$) of 0.8 mm, and (c) the surface of the antiglare layer has a concave-convex structure with an average spacing (S) between local peaks equal to or larger than 0.033 mm and equal to or smaller than 0.050 mm at a cutoff wavelength ($\lambda_c$) of 0.8 mm.

Because the antiglare film has a concave-convex structure on the antiglare layer surface, the external light falling on the antiglare film surface is scattered and an image of the external light reflected by the antiglare film surface is smudged. However, although increasing the degree of roughness of the concave-convex structure of the antiglare layer surface increases the smudginess (antiglare ability) of the external light image, scattering of the external light also increases and the entire screen becomes whitish (white blurring). Further, where large convexities are present on the antiglare layer surface, scattering of the external light also increases. As a result, not only the entire screen becomes whitish, but also when the surface is scratched with a hard substance, the concavities are caught thereby and erased, thereby easily causing defects and decreasing abrasive resistance.

The inventors have conducted a comprehensive study of a ten-point average roughness and an average spacing of local peaks at different cutoff wavelengths with the object of resolving the tradeoff problem associated with antiglare property, white blurring, and abrasive resistance and have found that this tradeoff problem can be resolved by setting all three surface roughness parameters within the desired ranges.

The ten-point average roughness ($Rz_1$, $Rz_2$) is a parameter representing an average height from a concavity to a convexity in the concave-convex structure of the surface. In this case, the ten-point average roughness ($Rz_1$) at a cutoff wavelength ($\lambda_c$) of 0.008 mm is a parameter mainly reflecting a concave-convex structure that is finer than the antiglare layer surface. The ten-point average roughness ($Rz_2$) at a cutoff wavelength ($\lambda_c$) of 0.8 mm is a parameter mainly reflecting a concave-convex structure that is coarser than the antiglare layer surface. The average spacing (S) of local peaks at a cutoff wavelength ($\lambda_c$) of 0.8 mm is a parameter reflecting the degree of steepness of convexities of the concave-convex structure of the antiglare layer surface.

In accordance with the present invention, where the ten-point average roughness ($Rz_1$) at a cutoff wavelength ($\lambda_c$) of 0.008 mm, which reflects a concave-convex structure that is finer than the antiglare layer surface, is less than 0.08 μm, the external light scattering becomes too small and antiglare ability is weakened. On the other hand, where the ten-point average roughness ($Rz_1$) is larger than 0.10 μm, the external light scattering becomes too large and white blurring occurs.

In accordance with the present invention, when the ten-point average roughness ($Rz_2$) at a cutoff wavelength ($\lambda_c$) of 0.8 mm, which reflects a concave-convex structure that is coarser than the antiglare layer surface, is less than 1.90 μm, the external light scattering becomes too small and antiglare ability is weakened. On the other hand, where the ten-point average roughness ($Rz_2$) is larger than 2.50 μm, the external light scattering becomes too large and white blurring occurs. Further, the number of convexities that are caught and erased when scratched by a hard substance increases and abrasive resistance decreases.

In accordance with the present invention, when the average spacing (S) of local peaks at a cutoff wavelength ($\lambda_c$) of 0.8 mm, which reflects the degree of steepness of convexities of the concave-convex structure of the antiglare surface, is less than 0.033 mm, the number of convexities that are caught and erased when scratched by a hard substance increases and abrasive resistance decreases. Furthermore, the external light scattering becomes too large and white blurring occurs. On the other hand, where, the average spacing (S) of local peaks is more than 0.050 mm, the concave-convex structure becomes smooth. Therefore, the external light is difficult to scatter and antiglare ability is degraded.

Further, in accordance with the present invention, the surface roughness (ten-point average roughness ($Rz_1$, $Rz_2$)) and average spacing (S) of local peaks are found by measurements based on JIS B0601-1994.

In the antiglare film in accordance with the present invention, all three parameters: (a) a ten-point average roughness ($Rz_1$) of the antiglare layer surface at a cutoff wavelength ($\lambda_c$) of 0.008 mm; (b) a ten-point average roughness ($Rz_2$) of the antiglare layer surface at a cutoff wavelength ($\lambda_c$) of 0.8 mm; and (c) an average spacing (S) between local peaks at a cutoff wavelength ($\lambda_c$) of 0.8 mm have to be within the predetermined ranges. Setting the ten-point average roughness ($Rz_1$, $Rz_2$) and average spacing (S) between local peaks within the predetermined ranges makes it possible for the first time to obtain an antiglare film combining all the following properties: (1) high antiglare ability in the front direction; (2) absence of white blurring; and (3) high abrasive resistance.

In accordance with the present invention, particles can be introduced in a binder matrix to form a concave-convex structure on the antiglare layer surface by the particles. In this case, when particles A and particles B of different average particle size are used as constituent materials of the antiglare layer, all three parameters: (a) a ten-point average roughness ($Rz_1$) of the antiglare layer surface at a cutoff wavelength ($\lambda_c$) of 0.008 mm; (b) a ten-point average roughness ($Rz_2$) of the antiglare layer surface at a cutoff wavelength ($\lambda_c$) of 0.8 mm; and (c) an average spacing (S) between local peaks at a cutoff wavelength ($\lambda_c$) of 0.8 mm can be easily set within the predetermined ranges. Also, when perticles C having the agglomeration state that primary particles are agglomerated, all three parameters: (a) a ten-point average roughness ($Rz_1$) of the antiglare layer surface at a cutoff wavelength ($\lambda_c$) of 0.008 mm; (b) a ten-point average roughness ($Rz_2$) of the antiglare layer surface at a cutoff wavelength ($\lambda_c$) of 0.8 mm; and (c) an average spacing (S) between local peaks at a cutoff wavelength ($\lambda_c$) of 0.8 mm can be easily set within the predetermined ranges.

The configurations of two antiglare films in accordance with the present invention obtained in the case in which particles A and particles B are used as the constituent materials of the antiglare layer and the case in which particles C are used as the constituent material of the antiglare layer will be described below.

Figure 2:
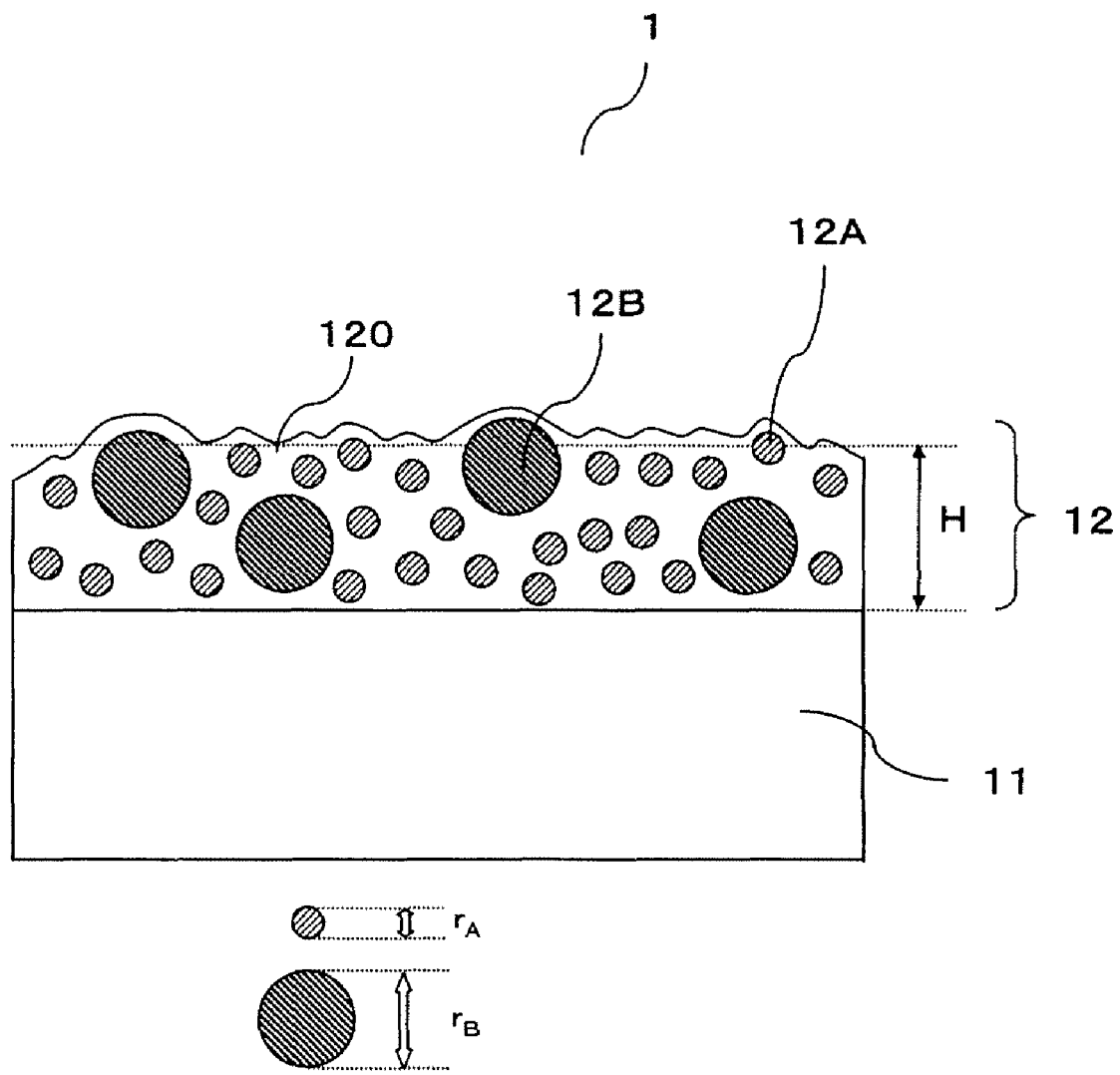
FIG. 2 is a cross-sectional schematic view of the antiglare film in accordance with the present invention in the case in which particles A and particles B are used in a material for forming the antiglare layer.

The antiglare film in accordance with the present invention in which particles A and particles B are used as the constituent materials of the antiglare layer will be described below. FIG. 2 is a cross-sectional schematic view of the antiglare film in accordance with the present invention in the case in which particles A and particles B are used as materials for forming the antiglare layer. In the configuration shown in FIG. 2 that is obtained when particles A and particles B are used in the antiglare film in accordance with the present invention, an antiglare film (1) has an antiglare layer (12) on a transparent base material (11), and the antiglare layer (12) contains a binder matrix (120), particles A (12A), and particles B (12B). In this case, the average particle size ($r_A$) of the particles A is within a range of equal to or larger than a value obtained by multiplying an average thickness (H) of the antiglare layer by 0.20 and equal to or smaller than a value obtained by multiplying the average thickness (H) of the antiglare layer by 0.40, and the average particle size ($r_B$) of the particles B is within a range of equal to or larger than a value obtained by multiplying an average thickness (H) of the antiglare layer by 0.60 and equal to or smaller than a value obtained by multiplying the average thickness (H) of the antiglare layer by 0.90.

When particles A and particles B that have sufficiently different average particle sizes are introduced into the binder matrix to form concavities and convexities on the antiglare layer surface, all three parameters: (a) a ten-point average roughness ($Rz_1$) of the antiglare layer surface at a cutoff wavelength ($\lambda_c$) of 0.008 mm; (b) a ten-point average roughness ($Rz_2$) of the antiglare layer surface at a cutoff wavelength ($\lambda_c$) of 0.8 mm; and (c) an average spacing (S) between local peaks at a cutoff wavelength ($\lambda_c$) of 0.8 mm can be easily set within the predetermined ranges.

In this case, the particles A for which the average particle size is within a range of equal to or larger than a value obtained by multiplying an average thickness (H) of the antiglare layer by 0.20 and equal to or smaller than a value obtained by multiplying the average thickness (H) of the antiglare layer by 0.40 mainly contribute to the formation on the antiglare layer surface of a finer concave-convex structure in which the ten-point average roughness ($Rz_1$) at a cutoff wavelength ($\lambda_c$) of 0.008 mm is 0.08 μm to 0.10 μm. Further, the particles B for which the average particle size is within a range of equal to or larger than a value obtained by multiplying an average thickness (H) of the antiglare layer by 0.60 and equal to or smaller than a value obtained by multiplying the average thickness (H) of the antiglare layer by 0.90 mainly contribute to the formation on the antiglare layer surface of a coarser concave-convex structure in which the ten-point average roughness ($Rz_2$) at a cutoff wavelength ($\lambda_c$) of 0.8 mm is 1.90 μm to 2.50 μm.

Thus, the particles A can easily form on the antiglare layer surface fine concavities and convexities such that the ten-point average roughness ($Rz_1$) at a cutoff wavelength ($\lambda_c$) of 0.008 mm is 0.08 μm to 0.10 μm, the particles B can easily form on the antiglare layer surface large concavities and convexities such that the ten-point average roughness ($Rz_2$) at a cutoff wavelength ($\lambda_c$) of 0.8 mm is 1.90 μm to 2.50 μm, and the concave-convex structure of the antiglare layer surface formed by the particles A and particles B can efficiently scatter the external light falling on the antiglare layer.

Further, when a ratio of a total weight of the particles A and the particles B contained in the antiglare layer to a weight of the binder matrix (particles:binder matrix) is within a range of 4:96 to 13:87, fine concavities and convexities such that an average spacing (S) between local peaks at a cutoff wavelength ($\lambda_c$) of 0.8 on the antiglare layer surface is within a range of from 0.033 mm to 0.050 mm can be easily formed on the antiglare layer surface. In accordance with the present invention, the weight of the binder matrix as referred to herein indicates a weight obtained by subtracting the weight of particles A and particles B from the weight of the antiglare layer (the weight of solids obtained by removing a solvent from the below-described coating liquid for forming the antiglare layer).

In accordance with the present invention, the average thickness (H) of the antiglare layer is an average value of the thickness of the antiglare layer having surface concavities and convexities. The average thickness of the antiglare layer can be found with an electronic micrometer and a fully automatic fine profile measurement device. Further, the average particles size ($r_A$, $r_B$) of particles A and particles B used in accordance with the present invention can be found with a particle side distribution measurement device of a light scattering type.

Figure 3:
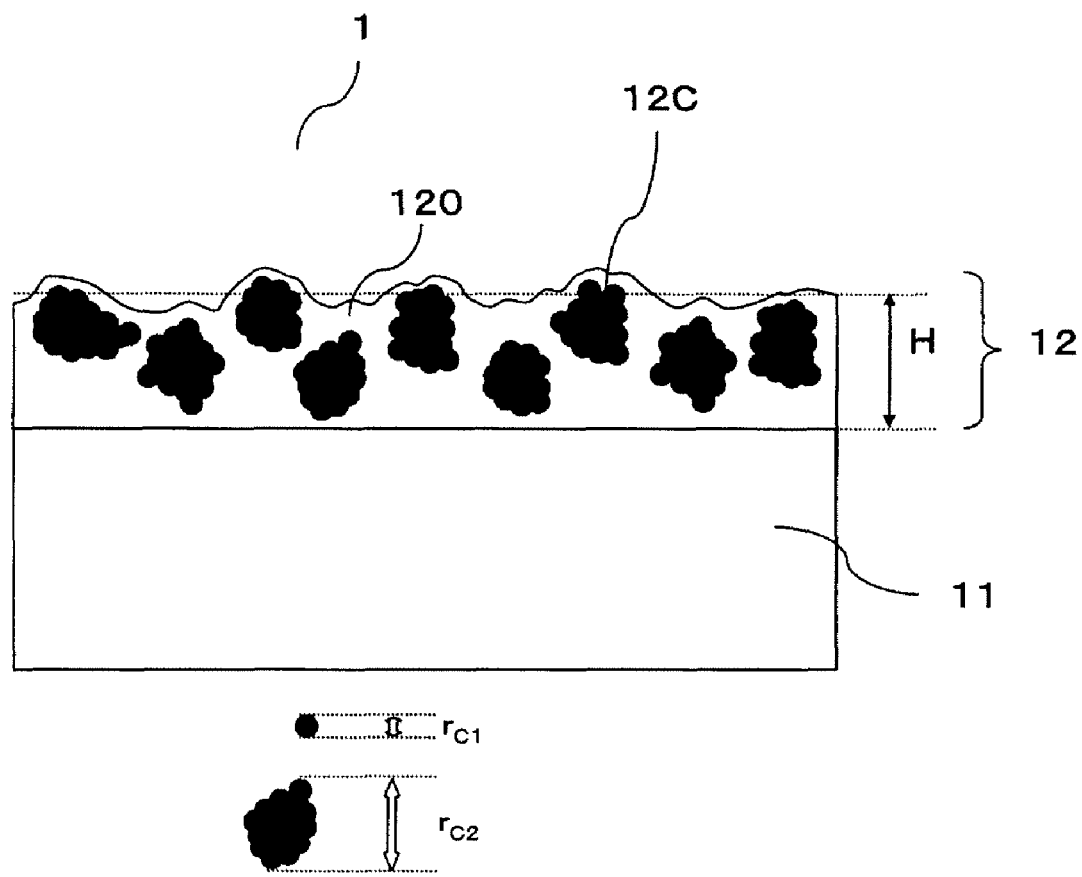
FIG. 3 is a cross-sectional schematic view of the antiglare film in accordance with the present invention in the case in which particles C are used in a material for forming the antiglare layer.

The antiglare film in accordance with the present invention that uses particles C in an aggregated state obtained by aggregation of primary particles will be described below. FIG. 3 is a cross-sectional schematic view of the antiglare film in accordance with the present invention in the case in which particles C are used as a material for forming the antiglare layer. In the configuration obtained when particles C in an aggregated state obtained by aggregation of primary particles are used in the antiglare film in accordance with the present invention, the antiglare film (1) has an antiglare layer (12) on a transparent base material (11), and the antiglare layer includes a binder matrix (120) and particles C (12C) in an aggregated state obtained by aggregation of primary particles. In this case, in the antiglare film in accordance with the present invention, an average particle size ($r_{C1}$) of primary particles is within a range of equal to or larger than 0.005 μm and equal to or smaller than 0.03 μm, and an average particle size of the particles C in an aggregated state, that is, the average particle size ($r_{C2}$) of secondary particles of particles C is within a range of equal to or larger than a value obtained by multiplying an average thickness (H) of the antiglare layer by 0.35 and equal to or smaller than a value obtained by multiplying the average thickness (H) of the antiglare layer by 0.80.

Where the particles C obtained by aggregation of primary particles are introduced in the binder matrix to form concavities and convexities on the antiglare layer surface, an antiglare film with the antiglare layer surface in which (a) a ten-point average roughness ($Rz_1$) of the antiglare layer surface at a cutoff wavelength ($\lambda_c$) of 0.008 mm; (b) a ten-point average roughness ($Rz_2$) of the antiglare layer surface at a cutoff wavelength ($\lambda_c$) of 0.8 mm; and (c) an average spacing (S) between local peaks at a cutoff wavelength ($\lambda_c$) of 0.8 mm are all within the predetermined ranges can be easily manufactured.

In this case, the particles C are in an aggregated state obtained by aggregation of primary particles. As a result, a fine concave-convex structure is provided on the surface thereof. The primary particles of the C particles with an average particle size of equal to or larger than 0.005 μm and equal to or smaller than 0.03 μm form finer concavities and convexities on the surface of particles C and mainly contribute to the formation of finer concavities and convexities such that a ten-point average roughness ($Rz_1$) at a cutoff wavelength ($\lambda_c$) of 0.008 mm is within a range of 0.08 μm to 0.10 μm.

The particles C in an aggregated state that have an average particle size within a range of equal to or larger than a value obtained by multiplying an average thickness (H) of the antiglare layer by 0.35 and equal to or smaller than a value obtained by multiplying the average thickness (H) of the antiglare layer by 0.80 contribute to the formation of coarse concavities and convexities such that a ten-point average roughness ($Rz_2$) at a cutoff wavelength ($\lambda_c$) of 0.8 mm is within a range of 1.90 μm to 2.50 μm on the antiglare layer surface.

Thus, because of a concave-convex structure of the surface of particles C formed by the primary particles and the particles C themselves (secondary particles) that are obtained by the aggregation of primary particles, the particles C can easily form fine concavities and convexities such that a ten-point average roughness ($Rz_1$) at a cutoff wavelength ($\lambda_c$) of 0.008 mm is within a range of 0.08 μm to 0.10 μm and coarse concavities and convexities such that a ten-point average roughness ($Rz_2$) at a cutoff wavelength ($\lambda_c$) of 0.8 mm is within a range of 1.90 μm to 2.50 μm on the antiglare layer surface, and the concave-convex structure formed on the antiglare layer surface by the particles C can efficiently scatter the external light falling on the antiglare layer.

Further, because a ratio of a weight of the particles C contained in the antiglare layer to a weight of the binder matrix (particles:binder matrix) is within a range of 4:96 to 13:87, fine concavities and convexities such that an average spacing (S) between local peaks at a cutoff wavelength ($\lambda_c$) of 0.8 mm on the antiglare layer surface is within a range of from 0.033 mm to 0.050 mm can be easily formed on the antiglare layer surface. In accordance with the present invention, the weight of the binder matrix as referred to herein indicates a weight obtained by subtracting the weight of particles C from the weight of the antiglare layer (the weight of solids obtained by removing a solvent from the below-described coating liquid for forming the antiglare layer).

In accordance with the present invention, the average thickness (H) of the antiglare layer is an average value of the thickness of the antiglare layer having surface concavities and convexities. The average thickness of the antiglare layer can be found with an electronic micrometer and a fully automatic fine profile measurement device. Further, the average particles size ($r_{C1}$) of primary particles of the particles C used in accordance with the present invention and the average particles size ($r_{C2}$) of the particles C in an aggregated state can be found with a particle size distribution measurement device of a light scattering type.

In the antiglare film in accordance with the present invention, the average thickness (H) of the antiglare layer is preferably within a range of 2 μm to 25 μm. When the average thickness of the antiglare layer is less than 2 μm, the obtained antiglare film sometimes cannot have a hardness sufficient for application to the display screen. On the other hand, when the average thickness of the antiglare layer exceeds 25 μm, the cost rises, the obtained antiglare film has significant curling, and the film is sometimes not suitable for processing required to provide the film on the display surface. An even more preferred average thickness of the antiglare layer is 3 μm to 12 μm.

If necessary, the antiglare film in accordance with the present invention is provided with functional layers demonstrating antireflective capability, antistatic capability, antifouling capability, electromagnetic shielding capability, infrared absorption capability, ultraviolet absorption capability, and color correction capability. Examples of such functional layers include an antireflection layer, an antistatic layer, an antifouling layer, an electromagnetic shielding layer, an infrared absorbing layer, an ultraviolet absorbing layer, and a color correcting layer. These functional layers may be provided individually or as a plurality of layers. One functional layer also may have a plurality of functions, for example, as an antireflection layer having antifouling capability. These functional layers may be provided between the transparent base material and antiglare layer, or on the antiglare layer. Further, in accordance with the present invention, a primer layer or an adhesive layer may be provided between the layers to improve adhesivity therebetween.

Figure 4:
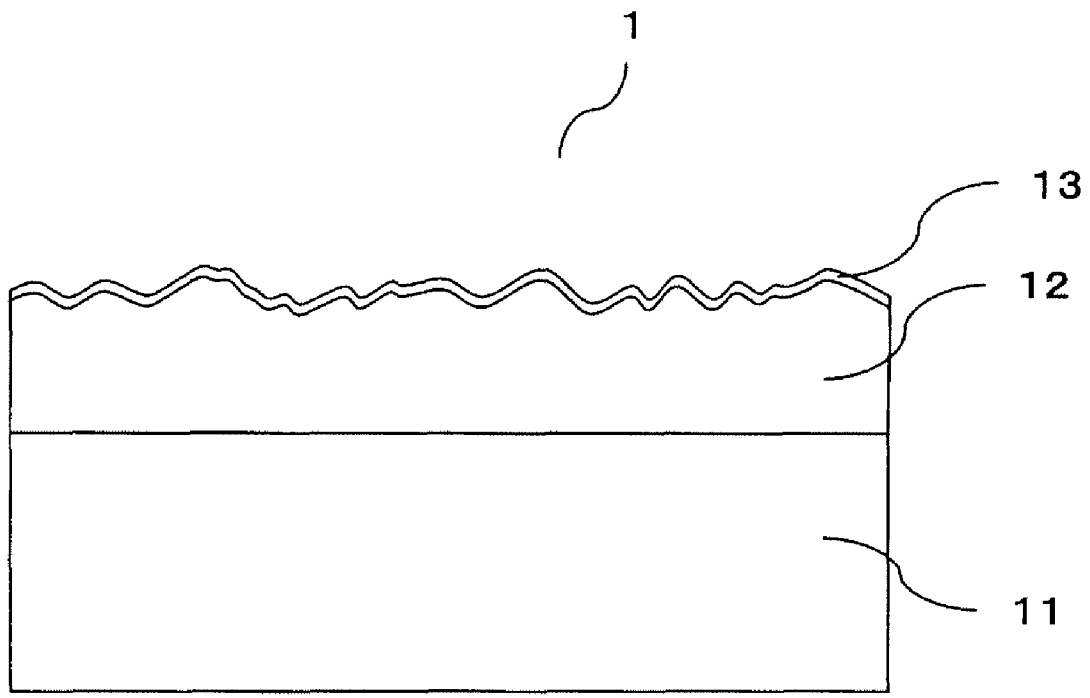
FIG. 4 is a cross-sectional schematic view of an antiglare film of another embodiment of the present invention.

FIG. 4 is a cross-sectional schematic view of an antiglare film of another embodiment of the present invention. In the antiglare film in accordance with the present invention that is shown in FIG. 4, an antiglare film (1) has an antiglare layer (12) on one surface of a transparent base material (11), and an antireflection layer (13) is provided on the antiglare layer (12). In this case, the antireflection layer can have a monolayer structure composed of a single layer with a low refractive index or a multilayer structure composed of a repetitive structure of layers with a low refractive index and layers with a high refractive index. In accordance with the present invention, the ten-point average roughness ($Rz_1$, $Rz_2$) and average spacing (S) of local peaks are the average roughness ($Rz_1$, $Rz_2$) and average spacing (S) of local peaks on the antiglare film surface on the side of the antiglare layer, and in the configuration shown in FIG. 4, they become the average roughness ($Rz_1$, $Rz_2$) and average spacing (S) of local peaks on the surface of the antireflection layer (13).

Figure 5:
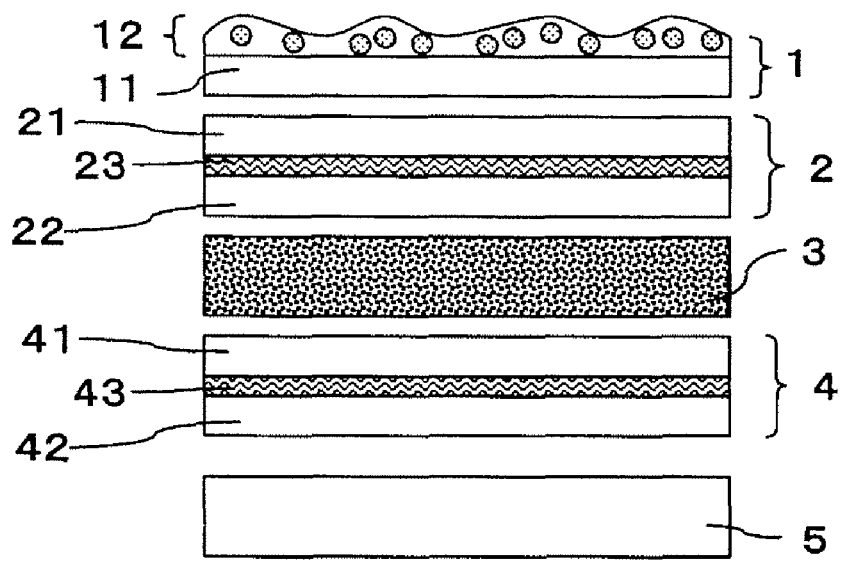
FIGS. 5A and 5B show a transmission-type liquid crystal display using the antiglare film in accordance with the present invention.
Figure 5:
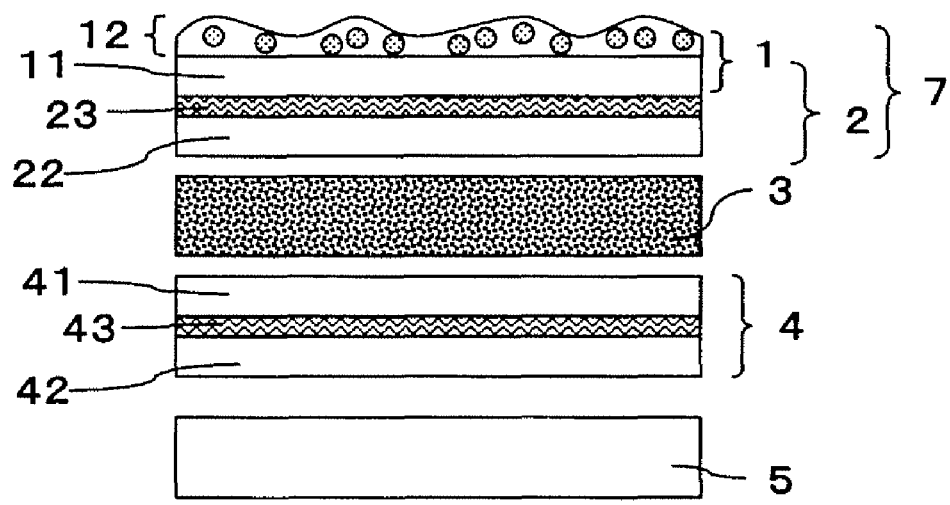

FIG. 5 shows a transmission-type liquid crystal display using the antiglare film in accordance with the present invention. In the transmission-type liquid crystal display shown in FIG. 5A, a backlight unit (5), a polarizing plate (4), a liquid crystal cell (3), a polarizing plate (2) and an antiglare film (1) are provided in the order of description. In this case, the side of the antiglare film (1) is the observation side, that is, the display surface.

The backlight unit (5) includes a light source and a light diffusion plate. The liquid crystal cell has a structure in which an electrode is provided on one transparent base material, an electrode and a color filter are provided on the other transparent base material, and a liquid crystal is sealed between the two electrodes. The polarizing plates are provided so as to sandwich the liquid crystal cell (3). In this structure, polarizing layers (23, 43) are sandwiched between the transparent base materials (21, 22, 41, 42).

FIG. 5A shows a transmission-type liquid crystal display in which the transparent base material (11) of the antiglare film (1) is provided separately from the transparent base material of the polarizing plate (2). On the other hand, FIG. 5B shows a structure in which the polarizing layer (23) is provided on the surface of the transparent base material (11) of the antiglare film (1) that is on the side opposite the antiglare layer, and the transparent base material (11) serves as a transparent base material of the antiglare film (1) and the transparent base material of the polarizing plate (2).

Further, the transmission-type liquid crystal display in accordance with the present invention may include other functional members. Examples of other functional members include a diffusion film, a prism sheet, a luminance-increasing film serving to use effectively the light emitted from the backlight, and also a phase difference film for compensating the phase difference of the polarizing plate or liquid crystal cell, but the transmission-type liquid crystal display in accordance with the present invention is not limited to these members.

A method for manufacturing the antiglare film in accordance with the present invention will be described below.

With the method for manufacturing the antiglare film in accordance with the present invention, an antiglare layer can be formed on the transparent base material by a process including a step of coating on a transparent base material a coating liquid for forming an antiglare film that contains at least a binder matrix forming material that is cured by ionizing radiation, particles A, and particles B and forming a coating film on the transparent base material and a step of curing the binder matrix forming material by ionizing radiation.

Further, in the method for manufacturing the antiglare film in accordance with the present invention, an antiglare layer can be formed on the transparent base material by a process including a step of coating on a transparent base material a coating liquid for forming an antiglare film that contains at least a binder matrix forming material that is cured by ionizing radiation and particles C in an aggregated state obtained by aggregation of primary particles and forming a coating film on the transparent base material and a step of curing the binder matrix forming material by ionizing radiation.

Glass or a plastic film can be used as the transparent base material employed in accordance with the present invention. The plastic film may have appropriate transparency and mechanical strength. For example, a film of polyethylene terephthalate (PET), triacetyl cellulose (TAC), diacetyl cellulose, acetyl cellulose butyrate, polyethylene naphthalate (PEN), a cycloolefin polymer, a polyamide, a polyethersulfone (PES), polymethyl methacrylate (PMMA), and a polycarbonate (PC) can be used. Among them, a triacetyl cellulose film can be used advantageously because of small birefringence and good transparency thereof. In particular, when the antiglare film in accordance with the present invention is provided on a liquid crystal display surface, triacetyl cellulose is especially preferred as the transparent base material.

Further, as shown in FIG. 5B, a polarizing layer can be also provided on the surface of the transparent base material located on the opposite side from the surface where the antiglare layer is located. In this case, for example, a stretched film of polyvinyl alcohol (PVA) having iodine added thereto can be used as the polarizing layer. The polarizing layer in this case is sandwiched by the transparent base materials.

The liquid for forming the antiglare layer contains at least a binder matrix forming material that is cured by ionizing radiation, particles A, and particles B. Alternatively, the liquid for forming the antiglare layer contains at least a binder matrix forming material that is cured by ionizing radiation and particles C in an aggregated state obtained by aggregation of primary particles.

In this case, a material curable by ionizing radiation can be used as the binder matrix forming material. Examples of materials that can be used as materials curable by ionizing radiation include polyfunctional acrylates such as acrylic acid or methacrylic acid esters of polyhydric alcohols, and polyfunctional urethane acrylates synthesized from diisocyanates, polyhydric alcohols, and hydroxy esters of acrylic acid or methacrylic acid. In addition, polyether resins, polyester resins, epoxy resins, alkyd resins, spyroacetal resins, polybutadiene resins, and polythiolpolyene resins having an acrylate functional group can be used as the materials curable by ionizing radiation.

Among them, trifunctional acrylate monomers or tetrafunctional acrylate monomers that are materials curable by ionizing radiation are preferred as the binder matrix forming materials. By using trifunctional acrylate monomers or tetrafunctional acrylate monomers, it is possible to obtain an antiglare film comprising sufficient abrasive resistance. Specific examples of trifunctional acrylate monomers and tetrafunctional acrylate monomers include trifunctional and tetrafunctional compounds from among polyfunctional acrylate monomers such as acrylic acid or methacrylic acid esters of polyhydric alcohols or polyfunctional urethane acrylate monomers synthesized from diisocyanates, polyhydric alcohols, and hydroxy esters of acrylic acid or methacrylic acid. In this case, the trifunctional acrylate monomers and tetrafunctional acrylate monomers are preferably used in a total amount equal to or larger than 80 wt. % based on the binder matrix forming material.

Further, in the binder matrix forming material, a thermoplastic resin can be also added to the material curable by ionizing radiation. Examples of suitable thermoplastic resins include cellulose derivatives such as acetyl cellulose, nitrocellulose, acetylbutyl cellulose, ethyl cellulose, and methyl cellulose, vinyl resins such as vinyl acetate and copolymers thereof, vinyl chloride and copolymers thereof, and vinylidene chloride and copolymers thereof, acetal resins such as polyvinyl formal and polyvinyl butyral, acrylic resins such as acrylic resin and copolymers thereof and methacrylic resin and copolymers thereof, polystyrene resin, polyamide resins, linear polyester resins, and polycarbonate resins. By adding a thermoplastic resin, it is possible to improve adhesivity of the transparent base material and antiglare layer. Further, by adding a thermoplastic resin, it is possible to inhibit the curling of the produced antiglare film.

Particles A and particles B used in accordance with the present invention can be appropriately selected from organic particles such as acrylic particles (refractive index 1.49), acryl-styrene particles (refractive index 1.49-1.59), polystyrene particles (refractive index 1.59), polycarbonate particles (refractive index 1.58), melamine particles (refractive index 1.66), epoxy particles (refractive index 1.58), polyurethane particles (refractive index 1.55), Nylon particles (refractive index 1.50), polyethylene particles (refractive index 1.50-1.56), polypropylene particles (refractive index 1.49), silicone particles (refractive index 1.43), polytetrafluoroethylene particles (refractive index 1.35), polyvinylidene fluoride particles (refractive index 1.42), polyvinyl chloride particles (refractive index 1.54), and polyvinylidene chloride particles (refractive index 1.62) and inorganic particles such as silica particles (refractive index 1.48), alumina particles (refractive index 1.76), talc (refractive index 1.54), various aluminosilicates (refractive index 1.50-1.60), kaolin clay (refractive index 1.53), and MgAl hydrotalcites (refractive index 1.50). When particles A and particles B are used, organic particles can be advantageously used. By using organic particles as particles A and particles B, it is possible to obtain an antiglare film having high transparency. Further, in accordance with the present invention, particles A and particles B may be from the same material. Further, it is preferred that particles A and particles B be spherical particles. The spherical particles referred to herein include perfectly spherical particles or ellipsoids.

The average particle size ($r_A$) of the particles A is within a range of equal to or larger than a value obtained by multiplying an average thickness (H) of the antiglare layer by 0.20 and equal to or smaller than a value obtained by multiplying the average thickness (H) of the antiglare layer by 0.40, and the average particle size ($r_B$) of the particles B is within a range of equal to or larger than a value obtained by multiplying an average thickness (H) of the antiglare layer by 0.60 and equal to or smaller than a value obtained by multiplying the average thickness (H) of the antiglare layer by 0.90.

Particles C in an aggregated state obtained by aggregation of primary particles that are used in accordance with the present invention can be appropriately selected from organic particles such as acrylic particles (refractive index 1.49), acryl-styrene particles (refractive index 1.49-1.59), polystyrene particles (refractive index 1.59), polycarbonate particles (refractive index 1.58), melamine particles (refractive index 1.66), epoxy particles (refractive index 1.58), polyurethane particles (refractive index 1.55), Nylon particles (refractive index 1.50), polyethylene particles (refractive index 1.50-1.56), polypropylene particles (refractive index 1.49), silicone particles (refractive index 1.43), polytetrafluoroethylene particles (refractive index 1.35), polyvinylidene fluoride particles (refractive index 1.42), polyvinyl chloride particles (refractive index 1.54), and polyvinylidene chloride particles (refractive index 1.62) and inorganic particles such as silica particles (refractive index 1.48), alumina particles (refractive index 1.76), talc (refractive index 1.54), various aluminosilicates (refractive index 1.50-1.60), kaolin clay (refractive index 1.53), and MgAl hydrotalcites (refractive index 1.50). Among them, from the standpoint of versatility, silica particles (refractive index 1.48) can be advantageously used. By using silica particles it is possible to provide the obtained antiglare film with an antiglare layer having a higher surface hardness. In this case, it is preferred that an average particle size ($r_{C_1}$) of primary particles be within a range of equal to or larger than 0.005 μm and equal to or smaller than 0.03 μm, and that an average particle size ($r_{C_2}$) of the particles C in the aggregated state be within a range of equal to or larger than a value obtained by multiplying an average thickness (H) of the antiglare layer by 0.35 and equal to or smaller than a value obtained by multiplying the average thickness (H) of the antiglare layer by 0.8.

When ultraviolet radiation is used as the ionizing radiation, a photopolymerization initiator is added to the coating liquid for forming an antiglare layer. Well known photopolymerization initiators can be used for this purpose, but it is preferred that the photopolymerization initiator contained in the binder matrix forming material be used. Examples of suitable photopolymerization initiators include benzoin and alkyl ethers thereof such as benzoin, benzoin methyl ether, benzoin ethyl ether, benzoin isopropyl ether, and benzyl methyl ketal. The amount of photopolymerization initiator used is 0.5-20 wt. %, preferably 1-5 wt. % based on the binder matrix forming material.

If necessary, a solvent is added to the coating liquid for forming an antiglare layer. By adding a solvent, it is possible to disperse uniformly the particles and binder matrix and also to adjust the viscosity of coating liquid to an adequate range when the coating liquid for forming an antiglare layer is coated on the transparent base material.

In accordance with the present invention, when triacetyl cellulose is used as the transparent base material and the antiglare layer is directly provided, without other functional layers, on the triacetyl cellulose film, it is preferred that a mixed solvent be used that includes a solvent that dissolves the triacetyl cellulose film or causes swelling thereof and a solvent that neither dissolves the triacetyl cellulose film nor causes swelling thereof. By using the mixed solvent, it is possible to obtain an antiglare film having sufficient adhesion on the interface of the triacetyl cellulose film and antiglare layer.

In this case, examples of solvents that dissolve a triacetyl cellulose film or cause swelling thereof include ethers such as dibutyl ether, dimethoxymethane, dimethoxyethane, diethoxyethane, propylene oxide, dioxane, dioxalan, trioxane, tetrahydrofuran, anisole, and phenetol, partial ketones such as acetone, methyl ethyl ketone, diethyl ketone, dipropyl ketone, diisobutyl ketone, cyclopentanone, cyclohexanone, methyl cyclohexanone, and methyl cyclohexanone, esters such as ethyl formate, propyl formate, n-pentyl formate, methyl acetate, ethyl acetate, methyl propionate, ethyl propionate, n-pentyl acetate, and γ-butyrolactone, and cellosolves such as methyl cellosolve, cellosolve, butyl cellosolve, and cellosolve acetate. These solvents can be used individually or in combinations of two or more thereof.

Examples of solvents that neither dissolve a triacetyl cellulose film nor cause swelling thereof include aromatic hydrocarbons such as toluene, xylene, cyclohexanone, and cyclohexylbenzene, hydrocarbons such as n-hexane, and partial ketones such as methyl isobutyl ketone and methyl butyl ketone. These solvents can be used individually or in combinations of two or more thereof.

In accordance with the present invention, an additive that is called a surface adjusting agent may be added to prevent the occurrence of coating defects such as peeling and uneven coating in the antiglare layer (coating film) that is formed by coating. Depending on the action thereof, the surface adjusting agent is also called a leveling agent, an antifoaming agent, an interface tension adjusting agent, and a surface tension adjusting agent, but all these agents act to decrease the surface tension of the coating film (antiglare layer).

Examples of additives that are usually used as the surface adjusting agent include silicone-based additive, fluorine-containing additive, and acrylic additives. Examples of suitable silicone-based additives include derivatives having polydimethylsiloxane as the basic structure in which a side chain of the polydimethylsiloxane structure is modified. For example, a polyether-modified dimethyl siloxane can be used as the silicone additive. Compounds having a perfluoroalkyl group are used as fluorine-containing additives. Compounds having a structure obtained by polymerizing an acryl monomer, a methacryl monomer, or a styrene monomer as the basic structure can be used as the acrylic additives. Further, compounds having a structure obtained by polymerizing an acryl monomer, a methacryl monomer, or a styrene monomer as the basic structure in which a substituent such as an alkyl group, a polyether group, a polyester group, a hydroxyl group, and an epoxy group is introduced in a side chain may be also used as the acrylic additive.

In addition to the above-described surface adjusting agent, other additives may be also added to the coating liquid for forming an antiglare layer in accordance with the present invention. However, it is preferred that these additives produce no adverse effect on transparency and light diffusing ability of the antiglare layer that is formed. Examples of functional additives include an antistatic agent, an ultraviolet absorbing agent, an infrared absorbing agent, an antifouling agent, a water repellent, a refractive index adjusting agent, an adhesivity increasing agent, and a curing agent. As a result, functions other than the antiglare function, such as an antistatic function, an ultraviolet absorption function, an infrared absorption function, an antifouling function, and a water repellent function can be imparted to the antiglare layer formed.

The coating liquid for forming an antiglare layer is coated on the transparent base material to form a coating film.

A coating method using a roll coater, a reverse roll coater, a gravure coater, a knife coater, a bar coater, or a die coater can be used as a method for coating the coating liquid for forming an antiglare layer on the transparent base material. Among these coaters, a die coater suitable for high-speed coating based on a roll-to-roll system is preferably used. The concentration of solids in the coating liquid differs depending on the coating method. The concentration of solids generally may be 30-70 wt. %.

Figure 6:
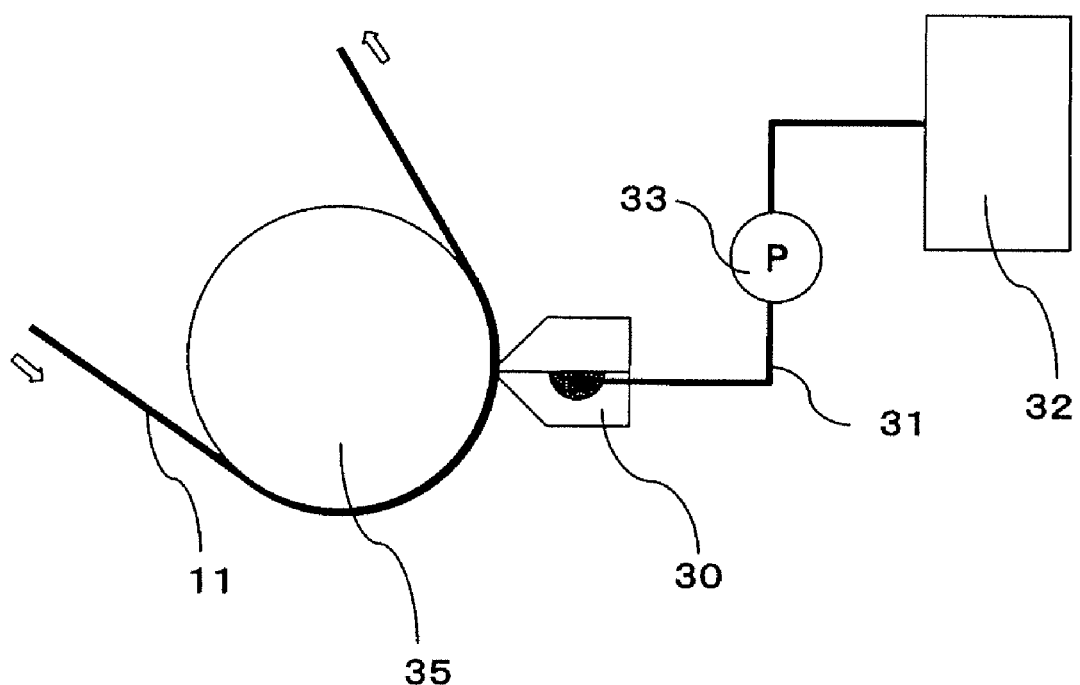
FIG. 6 is a schematic drawing of a coating apparatus using a die coater in accordance with the present invention.

A coating apparatus using a die coater in accordance with the present invention will be described below. FIG. 6 is a schematic drawing of a coating apparatus using a die coater in accordance with the present invention. The apparatus using a die coater in accordance with the present invention has a structure in which a die head 30 is connected by a pipe 31 to a coating liquid tank 32, and the coating liquid for forming an antiglare layer that is located in the coating liquid tank 32 is pumped by a liquid pump 33 into the die head 30. The coating liquid for forming an antiglare layer that has been pumped into the die head 30 is ejected from a slit gap, and a coating film is formed on a transparent base material 11. By using a wound transparent base material 11 and a rotary roller 35, it is possible to form a coating film continuously on the transparent base material by a roll-to-roll system.

An antiglare layer is formed by irradiating the coating film obtained by coating the coating liquid on the transparent base material with ionizing radiation. Ultraviolet radiation or electron beam can be used as the ionizing radiation. When ultraviolet curing is employed, a light source such as a high-pressure mercury lamp, a low-pressure mercury lamp, an ultrahigh-pressure mercury lamp, a metal halide lamp, a carbon arc, or a xenon arc can be used. Further, in the case of electron beam curing, an electron beam emitted from various electron beam accelerators such as a Cockroft-Walton accelerator, a Van de Graaff accelerator, a resonance transformer-type accelerator, an insulating core transformer-type accelerator, a linear accelerator, a dynamitron accelerator, or a high-frequency accelerator can be used. The electron beam preferably has an energy of 50-1000 KeV. An electron beam having an energy of 100-300 KeV is more preferred.

A drying process may be implemented before and after a step of forming the antiglare layer by curing. The curing and drying also may be performed simultaneously. In particular, when the coating liquid contains a binder matrix material, particles, and a solvent, a drying process has to be implemented before irradiation with ionizing radiation to remove the solvent contained in the coating film. Examples of suitable drying means include heating, air blowing, and hot air blowing.

In accordance with the present invention, in addition to a method using particles A and particles B as materials constituting the antiglare layer and a method using particles C in an aggregated state obtained by aggregation of primary particles as a material constituting the antiglare layer, an emboss method may be also used to form the antiglare layer having a concave-convex structure on the surface in which (a) a ten-point average roughness ($Rz_1$) of the antiglare layer surface at a cutoff wavelength ($\lambda_c$) of 0.008 mm; (b) a ten-point average roughness ($Rz_2$) of the antiglare layer surface at a cutoff wavelength ($\lambda_c$) of 0.8 mm; and (c) an average spacing (S) between local peaks at a cutoff wavelength ($\lambda_c$) of 0.8 mm are all within the predetermined ranges.

The antiglare film in accordance with the present invention is manufactured in the above-described manner.

A method for forming an antireflection layer in the antiglare film by which the antireflection layer such as shown in FIG. 4 is provided as a functional layer on the antiglare layer will be described below. The antireflection layer can have a monolayer structure composed of a single layer with a low refractive index or a multilayer structure composed of a repetitive structure of layers with a low refractive index and layers with a high refractive index. Methods for forming an antireflection layer can be classified into methods based on a wet film forming process in which a coating liquid for forming an antireflection layer is coated on the antiglare layer surface and methods by which the coating film is formed under vacuum, such as a vacuum vapor deposition method, a sputtering method, and a CVD method.

A method by which a single layer with a low refractive index is formed as an antireflection layer by a wet film forming method by coating a coating liquid for forming an antireflection layer on the antiglare layer surface will be described below. In this case, the thickness (d) of a single layer with a low refractive index that is the antireflection layer is designed such that an optical film thickness (nd) obtained by multiplying the film thickness (d) by a refractive index (n) of the layer with a low refractive index be equal to ¼ the visible light wavelength. A layer obtained by dispersing low-refractive particles in a binder matrix can be used as the layer with a low refractive index.

Examples of suitable particles with a low refractive index include particles composed of a low-refractive material such as magnesium fluoride, calcium fluoride, and porous silica. On the other hand, polyfunctional acrylates such as acrylic acid or methacrylic acid esters of polyhydric alcohols or polyfunctional urethane acrylates such as obtained by synthesis from diisocyanates, polyhydric alcohols, and acrylic acid or methacrylic acid hydroxy esters that are materials curable by ionizing radiation can be used as the binder matrix forming materials. In addition, polyether resins, polyester resins, epoxy resins, alkyd resins, spyroacetal resins, polybutadiene resins, and polythiolpolyene resins having acrylate functional groups can be used as the materials curable by ionizing radiation. When such materials curable by ionizing radiation are used, the binder matrix is formed by irradiation with ionizing radiation such as ultraviolet radiation or electron beam. Metal alkoxides, for example, silicon alkoxides such as tetramethoxysilane or tetramethoxysilane can be used as the binder matrix forming materials. In this case, inorganic or organic-inorganic composite binder matrix can be obtained by hydrolysis or dehydration condensation.

A layer with a low refractive index can be obtained not only by dispersing particles having a low refractive index in a binder matrix, but also from an fluorine-containing organic material having a low refractive index, without using the low-refractive particles.

Such a coating liquid for forming a layer with a low refractive index that contains the material having a low refractive index and the binder matrix forming material is coated on the antiglare layer surface. In this case, a solvent or a variety of additives can be added, as necessary, to the coating liquid for forming a layer with a low refractive index. The solvent can be appropriately selected with consideration for suitably for coating from among aromatic hydrocarbons such as toluene, xylene, cyclohexanone, and cyclohexylbenzene, hydrocarbons such as n-hexane, ethers such as dibutyl ether, dimethoxymethane, dimethoxyethane, diethoxyethane, propylene oxide, dioxane, dioxalan, trioxane, tetrahydrofuran, anisole, and phenetol, ketones such as methyl isobutyl ketone, methyl butyl ketone, acetone, methyl ethyl ketone, diethyl ketone, dipropyl ketone, diisobutyl ketone, cyclopentanone, cyclohexanone, methyl cyclohexanone, and methyl cyclohexanone, esters such as ethyl formate, propyl formate, n-pentyl formate, methyl acetate, ethyl acetate, methyl propionate, ethyl propionate, n-pentyl acetate, and γ-butyrolactone, cellosolves such as methyl cellosolve, cellosolve, butyl cellosolve, and cellosolve acetate, alcohols such as methanol, ethanol, and isopropyl alcohol, and water. Examples of other suitable additives include surface adjusting agents, antistatic agents, antifouling agents, water repellents, refractive index adjusting agents, adhesion improving agents, and curing agents.

A coating method using a roll coater, a reverse roll coater, a gravure coater, a knife coater, a bar coater, or a die coater can be used for coating.

When the material curable by ionizing radiation is used as the binder matrix forming material for the coating film obtained by coating the coating liquid on the transparent base material, a layer with a low refractive index can be formed, if necessary, by irradiation with ionizing radiation after the coating film has been dried. Further, when a metal alkoxide is used as the binder matrix forming material, a layer with a low refractive index is formed by a heating process and such drying and heating.

When a layer with a low refractive index is formed by a vacuum film forming process, the layer with a low refractive index can be obtained by forming a film of a material having a low refractive index, such as magnesium fluoride, by a vacuum deposition method. Further, in the case an antireflection layer is obtained that has a multilayer structure composed of a repetitive structure of layers with a low refractive index and layers with a high refractive index, the antireflection layer can be formed, for example, by forming titanium oxide as a layer with a high refractive index, silicon oxide as a layer with a low refractive index, titanium oxide as a layer with a high refractive index, and silicon oxide as a layer with low refractive index by a vacuum deposition method in the order of description from the antiglare layer side.

EXAMPLES

Examples are described below.

Example 1

A triacetyl cellulose film (TD-80U, manufactured by Fuji Photo Film Co., Ltd.) was used as a transparent base material. A liquid containing particles A (acryl-styrene copolymer spherical filler) and particles B (melamine spherical filler) having an average particle size ($r_A$, $r_B$) and a content in parts by weight shown in Table 1 and also 100 parts by weight of PE3 (pentaerythritol acrylate) manufactured by Kyoeisha Chemical Co., Ltd., 5 parts by weight of Irgacure 184 (photopolymerization initiator) manufactured by Chiba Specialty Chemicals Co., Ltd., and 110 part by weight of toluene was used as a coating liquid for forming an antiglare layer. The coating liquid for forming an antiglare layer was coated by a die coating method on the triacetyl cellulose film serving as a transparent base material by using a coating device employing a die coater such as shown in FIG. 6 and a coating film was formed. Once the coating film has been formed, the solvent was evaporated with a drying device, then ultraviolet irradiation at 400 mJ under an atmosphere with an oxygen concentration equal to or smaller than 0.03% was performed using a high-pressure mercury lamp, and an antiglare layer was formed. By the above-described process, an antiglare film having an antiglare layer on a transparent base material was produced.

Example 2

An antiglare film having an antiglare layer on a transparent base material was produced in the same manner as in Example 1, except that particles A and particles B of Example 1 were replaced with particles A and particles B of Example 2 described in Table 1.

Comparative Example 1

An antiglare film having an antiglare layer on a transparent base material was produced in the same manner as in Example 1, except that particles A and particles B of Example 1 were replaced with particles A and particles B of Comparative Example 1 described in Table 1.

Example 3

An antiglare film having an antiglare layer on a transparent base material was produced in the same manner as in Example 1, except that particles A and particles B of Example 1 were replaced with particles A and particles B of Example 3 described in Table 1.

Comparative Example 2

An antiglare film having an antiglare layer on a transparent base material was produced in the same manner as in Example 1, except that particles A and particles B of Example 1 were replaced with particles A and particles B of Comparative Example 2 described in Table 1.

Example 4

An antiglare film having an antiglare layer on a transparent base material was produced in the same manner as in Example 1, except that particles A and particles B of Example 1 were replaced with particles A and particles B of Example 4 described in Table 1.

Comparative Example 3

An antiglare film having an antiglare layer on a transparent base material was produced in the same manner as in Example 1, except that particles A and particles B of Example 1 were replaced with particles A and particles B of Comparative Example 3 described in Table 1.

Example 5

An antiglare film having an antiglare layer on a transparent base material was produced in the same manner as in Example 1, except that particles A and particles B of Example 1 were replaced with particles A and particles B of Example 5 described in Table 1.

Comparative Example 4

An antiglare film having an antiglare layer on a transparent base material was produced in the same manner as in Example 1, except that particles A and particles B of Example 1 were replaced with particles A and particles B of Comparative Example 4 described in Table 1.

Example 6

An antiglare film having an antiglare layer on a transparent base material was produced in the same manner as in Example 1, except that particles A and particles B of Example 1 were replaced with particles A and particles B of Example 6 described in Table 1.

Comparative Example 5

An antiglare film having an antiglare layer on a transparent base material was produced in the same manner as in Example 1, except that particles A and particles B of Example 1 were replaced with particles A and particles B of Comparative Example 5 described in Table 1.

Example 7

An antiglare film having an antiglare layer on a transparent base material was produced in the same manner as in Example 1, except that particles A and particles B of Example 1 were replaced with particles A and particles B of Example 7 described in Table 1.

Comparative Example 6

An antiglare film having an antiglare layer on a transparent base material was produced in the same manner as in Example 1, except that particles A and particles B of Example 1 were replaced with particles A and particles B of Comparative Example 6 described in Table 1.

The materials, content in parts by weight, and average particle size ($r_A$, $r_B$) used in Example 1 to Example 7 and Comparative Example 1 to Comparative Example 6 and also the average thickness (H) of the formed antiglare layers are shown in Table 1. The average particle size ($r_A$, $r_B$) of the particles A and particles B were measured using a particle size distribution measurement device of a light scattering type (SALD-7000, manufactured by Shimazu Corp.). The average thickness of the antiglare layer was measured with an electronic micrometer (K351C, manufactured by Anritsu Corp.).

TABLE 1

| | | Particles | | | Parts by weight | Average thickness (H) |
|---|---|---|---|---|---|---|
| | | | | (µm) | | (µm) |
| Example 1 | Particles A | Acryl-styrene copolymer spherical filler | Average particle size (rA) | 1.2 | 5 | 4.5 |
| | Particles B | Melamine spherical filler | Average particle size (rB) | 3.7 | 4 | |
| Example 2 | Particles A | Acryl-styrene copolymer spherical filler | Average particle size (rA) | 1.8 | 5 | 4.5 |
| | Particles B | Melamine spherical filler | Average particle size (rB) | 3.7 | 4 | |
| Comparative Example 1 | Particles A | Acryl-styrene copolymer spherical filler | Average particle size (rA) | 2.4 | 5 | 4.6 |
| | Particles B | Melamine spherical filler | Average particle size (rB) | 3.7 | 4 | |
| Example 3 | Particles A | Acryl-styrene copolymer spherical filler | Average particle size (rA) | 1.0 | 5 | 4.9 |
| | Particles B | Melamine spherical filler | Average particle size (rB) | 3.7 | 4 | |
| Comparative Example 2 | Particles A | Acryl-styrene copolymer spherical filler | Average particle size (rA) | 0.7 | 5 | 4.8 |
| | Particles B | Melamine spherical filler | Average particle size (rB) | 3.7 | 4 | |
| Example 4 | Particles A | Acryl-styrene copolymer spherical filler | Average particle size (rA) | 1.2 | 5 | 4.6 |
| | Particles B | Melamine spherical filler | Average particle size (rB) | 4.1 | 4 | |
| Comparative Example 3 | Particles A | Acryl-styrene copolymer spherical filler | Average particle size (rA) | 1.2 | 5 | 4.6 |
| | Particles B | Melamine spherical filler | Average particle size (rB) | 4.5 | 4 | |

TABLE 1-continued

| | | Particles | | (μm) | Parts by weight | Average thickness (H) (μm) |
|---|---|---|---|---|---|---|
| Example 5 | Particles A | Acryl-styrene copolymer spherical filler | Average particle size (rA) | 1.2 | 5 | 4.7 |
| | Particles B | Melamine spherical filler | Average particle size (rB) | 2.8 | 4 | |
| Comparative Example 4 | Particles A | Acryl-styrene copolymer spherical filler | Average particle size (rA) | 1.2 | 5 | 4.5 |
| | Particles B | Melamine spherical filler | Average particle size (rB) | 2.3 | 4 | |
| Example 6 | Particles A | Acryl-styrene copolymer spherical filler | Average particle size (rA) | 1.2 | 3 | 4.4 |
| | Particles B | Melamine spherical filler | Average particle size (rB) | 3.7 | 2 | |
| Comparative Example 5 | Particles A | Acryl-styrene copolymer spherical filler | Average particle size (rA) | 1.2 | 2 | 4.4 |
| | Particles B | Melamine spherical filler | Average particle size (rB) | 3.7 | 1 | |
| Example 7 | Particles A | Acryl-styrene copolymer spherical filler | Average particle size (rA) | 1.2 | 10 | 4.6 |
| | Particles B | Melamine spherical filler | Average particle size (rB) | 3.7 | 5 | |
| Comparative Example 6 | Particles A | Acryl-styrene copolymer spherical filler | Average particle size (rA) | 1.2 | 13 | 4.7 |
| | Particles B | Melamine spherical filler | Average particle size (rB) | 3.7 | 5 | |

Example 8

A triacetyl cellulose film (TD-80U, manufactured by Fuji Photo Film Co., Ltd.) was used as a transparent base material. A liquid containing particles C (silica aggregated filler of indeterminate shape) in an aggregated state obtained by aggregation of primary particles that are fine particles having an average particle size ($r_c$) and content in parts by weight shown in Table 2 and also 100 parts by weight of PE3 (pentaerythritol acrylate) manufactured by Kyoeisha Chemical Co., Ltd., 5 parts by weight of Irgacure 184 (photopolymerization initiator) manufactured by Chiba Specialty Chemicals Co., Ltd., and 110 part by weight of toluene was used as a coating liquid for forming an antiglare layer. The coating liquid for forming an antiglare layer was coated by a die coating method on the triacetyl cellulose film serving as a transparent base material by using a coating device employing a die coater such as shown in FIG. 6 and a coating film was formed. Once the coating film has been formed, the solvent was evaporated with a drying device, then ultraviolet irradiation at 400 mJ under an atmosphere with an oxygen concentration equal to or smaller than 0.03% was performed using a high-pressure mercury lamp, and an antiglare layer was formed. By the above-described process, an antiglare film having an antiglare layer on a transparent base material was produced.

Example 9

An antiglare film having an antiglare layer on a transparent base material was produced in the same manner as in Example 8, except that particles C in an aggregated state of Example 8 were replaced with particles C in an aggregated state of Example 9 described in Table 2.

Comparative Example 7

An antiglare film having an antiglare layer on a transparent base material was produced in the same manner as in Example 8, except that particles C in an aggregated state of Example 8 were replaced with particles C in an aggregated state of Comparative Example 7 described in Table 2.

Example 10

An antiglare film having an antiglare layer on a transparent base material was produced in the same manner as in Example 8, except that particles C in an aggregated state of Example 8 were replaced with particles C in an aggregated state of Example 10 described in Table 2.

Comparative Example 8

An antiglare film having an antiglare layer on a transparent base material was produced in the same manner as in Example 8, except that particles C in an aggregated state of Example 8 were replaced with particles C in an aggregated state of Comparative Example 8 described in Table 2.

Example 11

An antiglare film having an antiglare layer on a transparent base material was produced in the same manner as in Example 8, except that particles C in an aggregated state of Example 8 were replaced with particles C in an aggregated state of Example 11 described in Table 2.

Comparative Example 9

An antiglare film having an antiglare layer on a transparent base material was produced in the same manner as in Example 8, except that particles C in an aggregated state of Example 8 were replaced with particles C in an aggregated state of Comparative Example 9 described in Table 2.

Example 12

An antiglare film having an antiglare layer on a transparent base material was produced in the same manner as in Example 8, except that particles C in an aggregated state of Example 8 were replaced with particles C in an aggregated state of Example 12 described in Table 2.

Comparative Example 10

An antiglare film having an antiglare layer on a transparent base material was produced in the same manner as in Example 8, except that particles C in an aggregated state of Example 8 were replaced with particles C in an aggregated state of Comparative Example 10 described in Table 2.

Example 13

An antiglare film having an antiglare layer on a transparent base material was produced in the same manner as in Example 8, except that particles C in an aggregated state of Example 8 were replaced with particles C in an aggregated state of Example 13 described in Table 2.

Comparative Example 11

An antiglare film having an antiglare layer on a transparent base material was produced in the same manner as in Example 8, except that particles C in an aggregated state of Example 8 were replaced with particles C in an aggregated state of Comparative Example 11 described in Table 2.

Example 14

An antiglare film having an antiglare layer on a transparent base material was produced in the same manner as in Example 8, except that particles C in an aggregated state of Example 8 were replaced with particles C in an aggregated state of Example 14 described in Table 2.

Comparative Example 12

An antiglare film having an antiglare layer on a transparent base material was produced in the same manner as in Example 8, except that particles C in an aggregated state of Example 8 were replaced with particles C in an aggregated state of Comparative Example 12 described in Table 2.

The materials and content in parts by weight of particles C in an aggregated state used in Example 8 to Example 14 and Comparative Example 7 to Comparative Example 12, the average particle size of primary particles (primary particle size: $r_{C1}$), average particle size (secondary particle size $r_{C2}$) of particles C in an aggregated state, and average thickness (H) of the formed antiglare layer are shown in Table 2. The average particle size of primary particles (primary particle size: $r_{C1}$) of particles C in an aggregated state and the average particle size (secondary particle size $r_{C2}$) of particles C in an aggregated state were measured using a particle size distribution measurement device of a light scattering type (SALD-7000, manufactured by Shimazu Corp.). The average thickness of the antiglare layer was measured with an electronic micrometer (K351C, manufactured by Anritsu Corp.).

TABLE 2

| | | Particles | Primary particle size ($r_{C1}$) (µm) | Secondary particle size ($r_{C1}$) (µm) | Parts by weight | Average thickness (H) (µm) |
|---|---|---|---|---|---|---|
| Example 8 | Particles C | Silica aggregated filler of indeterminate shape | 0.020 | 2.5 | 8 | 4.4 |
| Example 9 | Particles C | Silica aggregated filler of indeterminate shape | 0.030 | 2.5 | 8 | 4.5 |
| Comparative Example 7 | Particles C | Silica aggregated filler of indeterminate shape | 0.050 | 2.5 | 8 | 4.5 |
| Example 10 | Particles C | Silica aggregated filler of indeterminate shape | 0.005 | 2.5 | 8 | 4.4 |
| Comparative Example 8 | Particles C | Silica aggregated filler of indeterminate shape | 0.002 | 2.5 | 8 | 4.6 |
| Example 11 | Particles C | Silica aggregated filler of indeterminate shape | 0.020 | 3.6 | 8 | 4.5 |
| Comparative Example 9 | Particles C | Silica aggregated filler of indeterminate shape | 0.020 | 4.1 | 8 | 4.5 |
| Example 12 | Particles C | Silica aggregated filler of indeterminate shape | 0.020 | 1.6 | 8 | 4.5 |
| Comparative Example 10 | Particles C | Silica aggregated filler of indeterminate shape | 0.020 | 1.2 | 8 | 4.7 |
| Example 13 | Particles C | Silica aggregated filler of indeterminate shape | 0.020 | 2.5 | 4.5 | 4.5 |
| Comparative Example 11 | Particles C | Silica aggregated filler of indeterminate shape | 0.020 | 2.5 | 3.8 | 4.6 |
| Example 14 | Particles C | Silica aggregated filler of indeterminate shape | 0.020 | 2.5 | 15 | 4.5 |
| Comparative Example 12 | Particles C | Silica aggregated filler of indeterminate shape | 0.020 | 2.5 | 17 | 4.5 |

The ten-point average roughness ($Rz_1$) at a cutoff wavelength ($\lambda_c$) of 0.008 mm, ten-point average roughness ($Rz_2$) at a cutoff wavelength ($\lambda_c$) of 0.8 mm, and average spacing (S) between local peaks at a cutoff wavelength ($\lambda_c$) of 0.8 mm were measured by the following methods with respect to the antiglare films obtained in examples and comparative examples. Further, the evaluation of antiglare ability, white blurring, and abrasive resistance was performed by the following methods.

<Ten-Point Average Roughness ($Rz_1$) at a Cutoff Wavelength ($\lambda_c$) of 0.008 mm>

$Rz_1$ was found for the surface of the antiglare films obtained in examples and comparative examples on the side where the antiglare layer is formed by using a high-precision surface profile measurement device (Surf Corder ET4000A, manufactured by Kosaka Laboratory, Ltd.) according to JIS-B0601-1994 at a cutoff wavelength ($\lambda_c$) of 0.008 mm, evaluation length 0.8 mm, and scanning speed 0.005 mm/sec.

<Ten-Point Average Roughness ($Rz_2$) at a Cutoff Wavelength ($\lambda_c$) of 0.8 mm>

$Rz_2$ was found for the surface of the antiglare films obtained in examples and comparative examples on the side where the antiglare layer is formed by using a high-precision surface profile measurement device (Surf Corder ET4000A, manufactured by Kosaka Laboratory, Ltd.) according to JIS-B0601-1994 at a cutoff wavelength ($\lambda_c$) of 0.8 mm, evaluation length 0.8 mm, and scanning speed 0.005 mm/sec.

<Average Spacing (S) Between Local Peaks at a Cutoff Wavelength ($\lambda_c$) of 0.8 mm>

S was found for the surface of the antiglare films obtained in examples and comparative examples on the side where the antiglare layer is formed by using a high-precision surface profile measurement device (Surf Corder ET4000A, manufactured by Kosaka Laboratory, Ltd.) according to JIS-B0601-1994 at a cutoff wavelength ($\lambda_c$) of 0.8 mm, evaluation length 0.8 mm, and scanning speed 0.005 mm/sec.

<Method for Evaluating Antiglare Ability>

The surface of the antiglare films obtained in examples and comparative examples on the side of a triacetyl cellulose film was pasted onto a black plastic sheet, and light of a fluorescent lamp was reflected on the antiglare layer formation surface of the antiglare films and visually evaluated. In this case, the sharpness of the reflected image of the fluorescent lamp and the like was visually evaluated. When the fluorescent lamp image was not seen at all, the evaluation result was represented by a circle symbol, and when a sharp image of the fluorescent lamp was observed, the evaluation result was represented by a cross.

<Method for Evaluating White Blurring>

The surface of the antiglare films obtained in examples and comparative examples on the side of a triacetyl cellulose film was pasted onto a black plastic sheet, and light of a fluorescent lamp was reflected on the antiglare layer formation surface of the antiglare films and visually evaluated. In this case, when the degree of diffusion of the fluorescent lamp light reflected on the antiglare film surface was small and no white blurring was felt on the antiglare film, the evaluation result was represented by a circle symbol, and when white blurring was felt to an impermissibly high degree, the evaluation result was represented by a cross.

<Method for Evaluating Abrasive Resistance>

The antiglare layer surface of the antiglare films obtained in examples and comparative examples was reciprocatingly rubbed with a steel wool (#0000) under a load of 250 g/cm$^2$, and scratches on the antiglare layer surface were visually evaluated. When no scratches were confirmed, the evaluation result was represented by a circle symbol, and when scratches were confirmed, the evaluation result was represented by a cross.

The results obtained in measuring the ten-point average roughness ($Rz_1$) at a cutoff wavelength ($\lambda_c$) of 0.008 mm and ten-point average roughness ($Rz_2$) at a cutoff wavelength ($\lambda_c$) of 0.8 mm, the results obtained in measuring the average spacing (S) between local peaks at a cutoff wavelength ($\lambda_c$) of 0.8 mm, and the evaluation results relating to antiglare ability, white blurring, and abrasive resistance of the antiglare films obtained in Example 1 to Example 7 and Comparative Example 1 to Comparative Example 6 are shown in Table 3. The values of $r_A/H$ obtained by dividing the average particle size ($r_A$) of particles A by the average thickness (H) of the antiglare layer and values of $r_B/H$ obtained by dividing the average particle size ($r_B$) of particles B by the average thickness (H) of the antiglare layer are also presented in Table 3. The values $(w_A+w_B)/(w_A+w_B+w_M)$ obtained by dividing the total weight of particles A and particles B by the weight of the antiglare layer (total weight of particles A, particles B, and binder matrix forming materials) are also shown in the table.

TABLE 3

| | $r_A/H$ | $r_B/H$ | $(w_A+w_B)/(w_A+w_B+w_M)$ | $Rz_1$ (µm) | $Rz_2$ (µm) | S (mm) | White blurring | Antiglare ability | Abrasive resistance |
|---|---|---|---|---|---|---|---|---|---|
| Example 1 | 0.27 | 0.82 | 7.9 | 0.09 | 2.2 | 0.042 | ○ | ○ | ○ |
| Example 2 | 0.40 | 0.82 | 7.9 | 0.09 | 2.2 | 0.040 | ○ | ○ | ○ |
| Comparative Example 1 | 0.52 | 0.80 | 7.9 | 0.12 | 2.3 | 0.038 | X | ○ | ○ |
| Example 3 | 0.20 | 0.76 | 7.9 | 0.09 | 2.2 | 0.041 | ○ | ○ | ○ |
| Comparative Example 2 | 0.15 | 0.77 | 7.9 | 0.07 | 2.1 | 0.041 | ○ | X | ○ |
| Example 4 | 0.26 | 0.89 | 7.9 | 0.09 | 2.3 | 0.040 | ○ | ○ | ○ |
| Comparative Example 3 | 0.26 | 0.98 | 7.9 | 0.10 | 2.7 | 0.041 | X | ○ | X |
| Example 5 | 0.26 | 0.60 | 7.9 | 0.09 | 2.1 | 0.039 | ○ | ○ | ○ |
| Comparative Example 4 | 0.27 | 0.51 | 7.9 | 0.08 | 1.8 | 0.038 | ○ | X | ○ |
| Example 6 | 0.27 | 0.84 | 4.5 | 0.09 | 2.2 | 0.050 | ○ | ○ | ○ |
| Comparative Example 5 | 0.27 | 0.84 | 2.8 | 0.09 | 2.1 | 0.055 | ○ | X | ○ |
| Example 7 | 0.26 | 0.80 | 12.5 | 0.09 | 2.2 | 0.033 | ○ | ○ | ○ |
| Comparative Example 6 | 0.26 | 0.79 | 14.6 | 0.09 | 2.2 | 0.030 | X | ○ | X |

The results obtained in measuring the ten-point average roughness ($Rz_1$) at a cutoff wavelength ($\lambda_c$) of 0.008 mm and ten-point average roughness ($Rz_2$) at a cutoff wavelength ($\lambda_c$) of 0.8 mm, the results obtained in measuring the average spacing (S) between local peaks at a cutoff wavelength ($\lambda_c$) of 0.8 mm, and the evaluation results relating to antiglare ability, white blurring, and abrasive resistance of the antiglare films obtained in Example 8 to Example 14 and Comparative Example 7 to Comparative Example 12 are shown in Table 4. The values of $r_{C_1}$ that is the average particle size (primary particle size $r_{C_1}$) of primary particles of particles C and the values of $r_{C_2}/H$ obtained by dividing the average particle size (secondary particle size: $r_{C_2}$) of particles C in an aggregated state by the average thickness (H) of the antiglare layer are also shown in Table 4. The values ($w_C/(w_C+w_M)$) obtained by dividing the total weight of particles C by the weight of the antiglare layer (total weight of particles C and binder matrix forming materials) are also shown in the table.

TABLE 4

|  | $r_{C_1}$ (μm) | $r_{C_2}/H$ | $w_C/(w_C+w_M)$ | $Rz_1$ (μm) | $Rz_2$ (μm) | S (mm) | White blurring | Antiglare ability | Abrasive resistance |
| --- | --- | --- | --- | --- | --- | --- | --- | --- | --- |
| Example 8 | 0.020 | 0.57 | 7.1 | 0.08 | 2.2 | 0.041 | ○ | ○ | ○ |
| Example 9 | 0.030 | 0.56 | 7.1 | 0.09 | 2.1 | 0.040 | ○ | ○ | ○ |
| Comparative Example 7 | 0.050 | 0.56 | 7.1 | 0.12 | 2.1 | 0.040 | X | ○ | ○ |
| Example 10 | 0.005 | 0.57 | 7.1 | 0.08 | 2.1 | 0.038 | ○ | ○ | ○ |
| Comparative Example 8 | 0.002 | 0.54 | 7.1 | 0.07 | 2.1 | 0.037 | ○ | X | ○ |
| Example 11 | 0.020 | 0.80 | 7.1 | 0.09 | 2.3 | 0.041 | ○ | ○ | ○ |
| Comparative Example 9 | 0.020 | 0.91 | 7.1 | 0.09 | 2.7 | 0.041 | X | ○ | X |
| Example 12 | 0.020 | 0.36 | 7.1 | 0.08 | 2.0 | 0.039 | ○ | ○ | ○ |
| Comparative Example 10 | 0.020 | 0.26 | 7.1 | 0.08 | 1.7 | 0.039 | ○ | X | ○ |
| Example 13 | 0.020 | 0.56 | 4.1 | 0.09 | 2.2 | 0.050 | ○ | ○ | ○ |
| Comparative Example 11 | 0.020 | 0.54 | 3.5 | 0.08 | 2.1 | 0.057 | ○ | X | ○ |
| Example 14 | 0.020 | 0.56 | 12.5 | 0.09 | 2.2 | 0.033 | ○ | ○ | ○ |
| Comparative Example 12 | 0.020 | 0.56 | 13.9 | 0.09 | 2.2 | 0.029 | X | ○ | X |

What is claimed is:

1. An antiglare film comprising:
   a transparent substrate;
   an antiglare layer comprising particles and a binder matrix on the transparent substrate; and
   an antiglare film surface on the antiglare layer side having a concave-convex structure with a ten-point average roughness ($Rz_1$) equal to or larger than 0.08 μm and equal to or smaller than 0.10 μm at a cutoff wavelength ($\lambda_c$) of 0.008 mm, wherein
   the antiglare film surface on the antiglare layer side having a concave-convex structure with a ten-point average roughness ($Rz_2$) equal to or larger than 1.90 μm and equal to or smaller than 2.50 μm at a cutoff wavelength ($\lambda_c$) of 0.8 mm, and
   the antiglare film surface on the antiglare layer side having a concave-convex structure with an average spacing (S) between local peaks equal to or larger than 0.033 mm and equal to or smaller than 0.050 mm at a cutoff wavelength ($\lambda_c$) of 0.8 mm.

2. The antiglare film according to claim 1, wherein
   the particles of the antiglare layer comprise particles A and particles B of different average particle sizes;
   the average particle size ($r_A$) of the particles A is within a range of equal to or larger than a value obtained by multiplying an average thickness (H) of the antiglare layer by 0.20 and equal to or smaller than a value obtained by multiplying the average thickness (H) of the antiglare layer by 0.40; and
   the average particle size ($r_B$) of the particles B is within a range of equal to or larger than a value obtained by multiplying an average thickness (H) of the antiglare layer by 0.60 and equal to or smaller than a value obtained by multiplying the average thickness (H) of the antiglare layer by 0.90.

3. The antiglare film according to claim 2, wherein
   a ratio of a total weight of the particles A and particles B to a weight of the binder matrix is within a range of 4:96 to 13:87.

4. The antiglare film according to claim 1, wherein
   the particles of the antiglare layer comprise particles C, each of which is in an aggregated state obtained by aggregation of primary particles that are fine particles;
   an average particle size ($r_{C_1}$) of the primary particles of the particles C is within a range of equal to or larger than 0.005 μm and equal to or smaller than 0.03 μm; and
   an average particle size ($r_{C_2}$) of the particles C in the aggregated state is within a range of equal to or larger than a value obtained by multiplying an average thickness (H) of the antiglare layer by 0.35 and equal to or smaller than a value obtained by multiplying the average thickness (H) of the antiglare layer by 0.80.

5. The antiglare film according to claim 4, wherein
   a weight ratio of the particles C and the binder matrix is within a range of 4:96 to 13:87.

6. A liquid crystal display comprising, in the order of description from an observer side, the antiglare film according to claim 1, a polarizing plate, a liquid crystal cell, a polarizing plate, and a backlight unit.

* * * * *